(12) United States Patent
Steffan et al.

(10) Patent No.: US 6,171,874 B1
(45) Date of Patent: Jan. 9, 2001

(54) NON-DEFECT IMAGE AND DATA TRANSFER AND STORAGE METHODOLOGY

(75) Inventors: Paul J. Steffan, Elk Grove; Allen S. Yu, Fremont, both of CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/247,242

(22) Filed: Feb. 9, 1999

(51) Int. Cl.[7] .............................. G01R 31/26; H01L 21/66

(52) U.S. Cl. ................................ 438/14; 382/145; 438/16

(58) Field of Search ................................ 438/14, 15, 16, 438/17, 18; 702/35, 83; 382/145

(56) References Cited

U.S. PATENT DOCUMENTS

| 5,712,571 | * | 1/1998 | O'Donoghue | 324/539 |
| 5,761,064 | * | 6/1998 | La et al. | 364/438.175 |
| 5,828,778 | * | 10/1998 | Hagi et al. | 382/145 |
| 5,923,430 | * | 7/1999 | Worster et al. | 356/394 |
| 5,981,949 | * | 11/1999 | Leahy et al. | 250/332 |
| 5,982,920 | * | 11/1999 | Tobin et al. | 382/145 |
| 6,021,380 | * | 2/2000 | Fredriksen et al. | 702/35 |

* cited by examiner

*Primary Examiner*—John F. Niebling
*Assistant Examiner*—Viktor Simkovic
(74) *Attorney, Agent, or Firm*—H. Donald Nelson

(57) ABSTRACT

A method of manufacturing semiconductor devices wherein images of non-defect anomalies are captured and stored with image data and linkage data in a database. The non-defect anomaly data is stored in database for later retrieval.

4 Claims, 2 Drawing Sheets

NON-DEFECT IMAGE AND DATA TRANSFER AND STORAGE METHODOLOGY

BACKGROUND OF THE INVENTION

1. Field of the Invention

This invention relates generally to the manufacturing of high performance semiconductor devices. More specifically, this invention relates to a method of capturing and storing non-defect image and data information. Even more specifically, this invention relates to a method of capturing and storing non-defect image and data with linkage information in a data management system.

2. Discussion of the Related Art

In order to remain competitive, a semiconductor manufacturer must continually increase the performance of the semiconductor integrated circuits being manufactured and at the same time, reduce the cost of the semiconductor integrated circuits. Part of the increase in performance and the reduction in cost of the semiconductor integrated circuits is accomplished by shrinking the device dimensions and by increasing the number of circuits per unit area on an integrated circuit chip. Another part of reducing the cost of a semiconductor chip is to increase the yield. As is known in the semiconductor manufacturing art, the yield of chips (also known as die) from each wafer is not 100% because of defects occurring during the manufacturing process. The number of good chips obtained from a wafer determines the yield. As can be appreciated, chips that must be discarded because of a defect increases the cost of the remaining usable chips.

Each semiconductor chip requires numerous process steps such as oxidation, etching, metallization and wet chemical cleaning. In order to etch metal lines, for example, a layer of photoresist is formed on the surface of the semiconductor chips and patterned by developing the photoresist and washing away the unwanted portion of the photoresist. Because the metal lines and other metal structures have "critical" dimensions, that is, dimensions that can affect the performance of the semiconductor chip, the process of forming the photoresist pattern for each layer is examined during the manufacturing process. Some of these process steps involve placing the wafer on which the semiconductor chips are being manufactured into different tools during the manufacturing process. The optimization of each of these process steps requires an understanding of a variety of chemical reactions and physical processes in order to produce high performance, high yield circuits. The ability to view and characterize the surface and interface layers of a semiconductor chip in terms of their morphology, chemical composition and distribution is an invaluable aid to those involved in research and development, process, problem solving, and failure analysis of integrated circuits.

In the course of modern semiconductor manufacturing, semiconductor wafers are routinely inspected using "scanning" tools to find defects. The scanning tool determines the location and other information concerning defects that are caught and this information is stored in a data file for later recapture and inspection of any of the defects. These data files are stored in a relational database that has the ability to generate wafer maps with defects shown in their relative positions. The data database typically has the ability to send these wafer map files to various review tools within the manufacturing plant. This is very useful as it allows for re-inspection on various after-scan inspection tools within the manufacturing plant. These inspection tools include Optical Microscopes and Scanning Electron Microscopes (SEMs) that allow for classification of the defects. Images taken on the various after-scan inspection tools can be linked by linkage data to the defect on a wafer map and reviewed at a workstation at an engineer's or technician's convenience.

Wafers are also inspected on various microscopes and SEM's without the benefit of first being scanned and thus no wafer map file can be generated for these type inspections. These types of inspections are the various after DIs (Develop Inspections) and/or after etch inspections, as well as CD (critical dimension) monitoring, which routinely occur during the manufacturing process. These "views" and their locations, once inspected, are either captured on a printout or discarded.

FIG. 1 shows a typical prior art inspection methodology. A wafer lot is started through a manufacturing process, as indicated at 100. The first layer of each wafer of the wafer lot is subjected to a first process, 102. After the first process, a selected number of wafers are subjected to an ADI (after develop inspection) at 104. The after develop inspection is done on various microscopes and/or SEMs by an operator. The operator performs the various DI (develop inspections) and/or after etch inspections, as well as performing CD (critical dimension) monitoring of selected features on the wafer. The operator has the capability to capture an image 106 of one of the features if there is an anomaly to one of the features that is of interest. The operator determines at 108 if the wafers should be further processed. If the operator determines that the wafers should not be further processed, the wafers are reworked at 110. If the operator determines that the wafers are in a condition for further processing, the layer just processed on the wafers is inspected for defects, at 112. The wafers are typically inspected on various scanning tools that identify defects. The defect data is stored 114 in a data file along with position data in a DMS (data management system) 116. It is determined at 118 if a wafer map exists for the wafer. If a wafer map exists, the defect data is added to the existing wafer map, at 120. If a wafer map does not exist, a wafer map is created at 122. After the layer is inspected at 112, it is determined if the layer just inspected is the last layer, at 124. If it is determined at 124 that the layer just inspected is not the last layer, the wafers are sent to the next process at 126 and the wafers are returned to the process at 104. If it is determined at 124 that the layer just inspected is the last layer, the process is finished 128.

It has been increasingly noted that semiconductor devices have failures associated with faulty critical dimensions, some of which in turn have been associated with faulty photoresist development or etch processes. However, because the data concerning the critical dimensions, photoresist development or the etch process have either not been kept or, if they have been kept, they can not be linked to either a particular lot, a particular wafer, a particular layer or a particular xy position.

Therefore, what is needed is a method of transferring the image file and related data from a review tool, such as an SEM, ADI inspection station, Tilt SEM, etc., to a defect management station. The review tool would generate a small file containing operator generated information, for example, ProductID, LotID, WaferID, LayerID, etc., and the tool would generate machine generated information, such as, x location, y location, path to image file, etc. The defect management system would then, based on previous knowledge of the product, such as, for example, die pitch and placement, either generate a new wafer map for the particular Lot/Wafer/Layer or append the current map, if it exists, and send the image file to its own image server.

SUMMARY OF THE INVENTION

According to the present invention, the foregoing and other objects and advantages are attained by a method of manufacturing high performance semiconductor integrated devices in which non-defect images, image data and linkage data for the nondefect images are stored in a database that is available for later retrieval.

In accordance with an aspect of the invention, at least one inspection wafer is selected from a lot of semiconductor wafers and non-defect anomalies are captured and stored and added to a wafer map.

In another aspect of the invention, the layer on the lot of semiconductor wafers is then inspected for defects and the defect information is added to the wafer map.

The method of the present invention thus effectively provides a semiconductor manufacturing process for the manufacturing of high performance integrated circuits that provides a method of capturing images of selected anomalies and storing the selected anomaly information in a database so that it is retrievable for later review and analysis.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiments when read in conjunction with the accompanying drawings, wherein:

DETAILED DESCRIPTION

Reference is now made in detail to specific embodiments of the present invention which illustrate the best mode presently contemplated by the inventors for practicing the invention.

Figure 1:
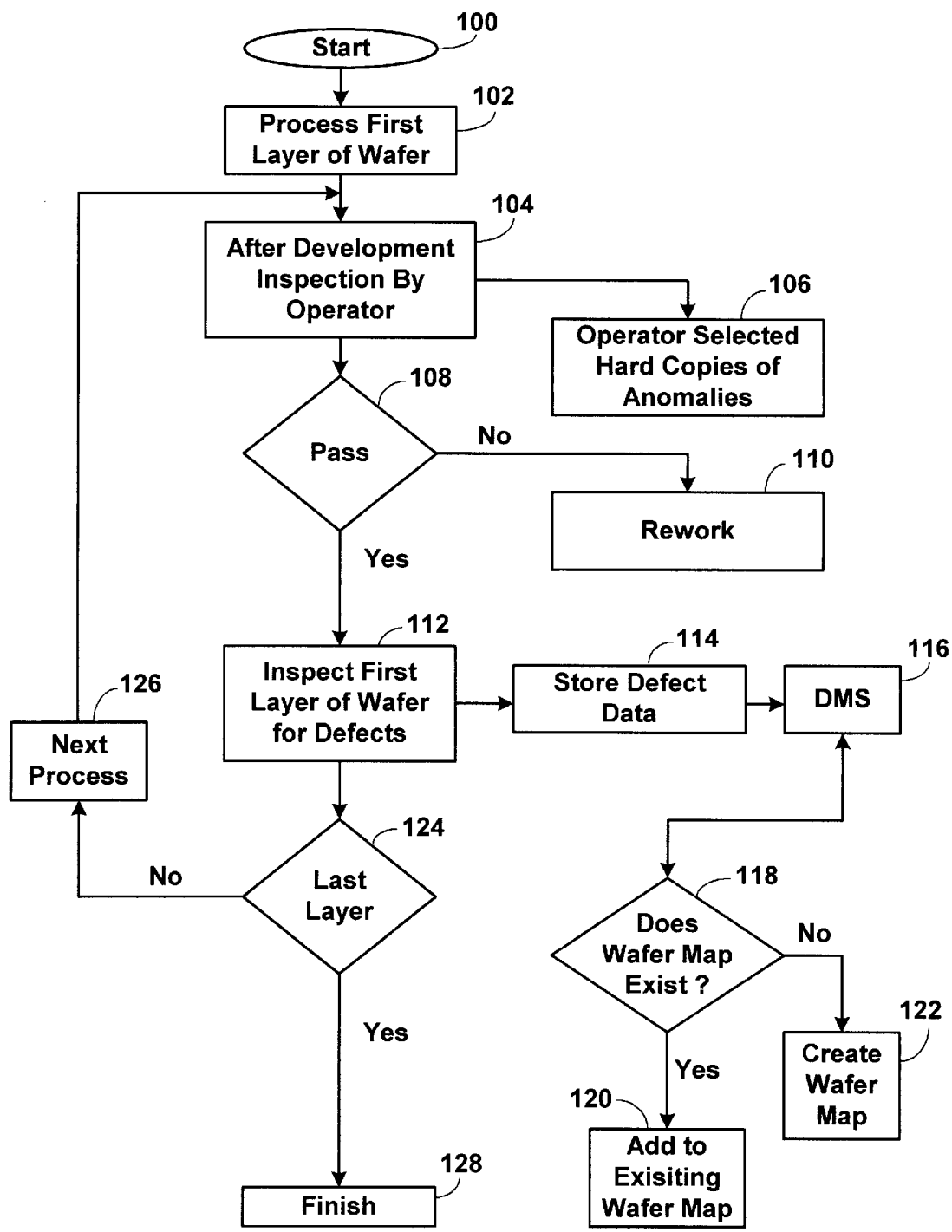
FIG. 1 illustrates a prior art method of inspecting wafers after each layer of the wafer is processed.
Figure 2:
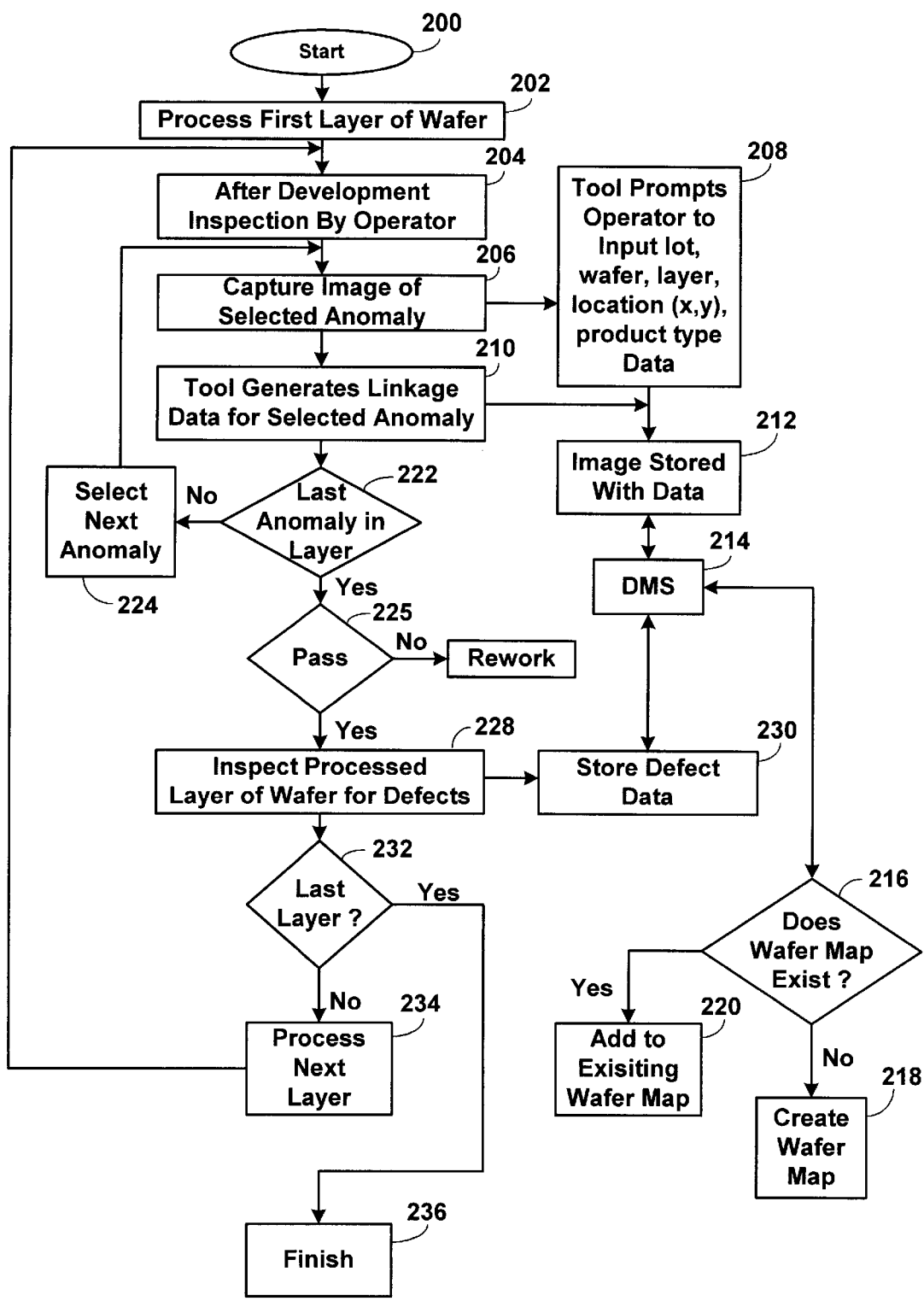
FIG. 2 illustrates a method of inspecting wafers after each layer of the wafer is processed in accordance with the present invention.

FIG. 2 illustrates a method of inspecting wafers after each layer of the wafer is processed in accordance with the present invention.

A wafer is started through a manufacturing process, as indicated at 200. The first layer of each wafer of the wafer lot is subjected to a first process, as indicated at 202. Typically, a wafer lot could be approximately 20 wafers and one or more wafers of the lot are selected to be inspection wafers. Inspection wafers are used for inspection and represent the entire lot because it would be too expensive and time consuming to inspect each and every wafer. The inspection wafers are subjected to an ADI (after develop inspection) at 204 by an operator. The after develop inspection is conducted on various tools such as a microscope or a scanning electron microscope (SEM). The operator selects features that appear to have an anomaly and captures an image of the anomaly via the inspection tool at 206. The tool prompts the operator at 208 to input lot identification, wafer identification, layer identification, coordinate location, and product type data. The tool generates linkage data for the selected anomaly at 210. The linkage data is information concerning where the image is stored so that the image can be retrieved at a later time. The operator generated data from 208 is combined with the linkage data from 210 and is stored with the image at 212. The image and data is forwarded to a DMS (defect management system) server and data base at 214. The defect management system determines at 216 if a wafer map exists for the particular wafer being processed. If it is determined at 216 that a wafer map does not exist, a wafer map is created, at 218. If it is determined at 216 that a wafer map does exist, the image and data is added to the existing wafer map at 220.

After the tool generates linkage data for the selected anomaly at 210, it is determined at 222 if the anomaly just captured is the last anomaly. If it is determined at 222 that the anomaly just captured and stored is not the last anomaly, the operator selects the next anomaly at 224 and an image of the anomaly is captured at 206. If it is determined at 222 that the anomaly is the last anomaly, the operator determines at 225 if the wafer lot should be passed to the next step in the process. If it is determined at 225 that the wafer lot should not be passed to the next step in the process, the wafer lot is reworked as indicated at 226. If it is determined at 225 that the wafer lot should be passed to the next step in the process, the layer just processed is inspected for defects at 228. Defect data is stored at 230 and information concerning the defect is sent to the defect management system at 214. After the layer just processed is inspected, it is determined at 232 if the layer just inspected is the last layer. If the layer just inspected is determined at 232 to not be the last layer, the next layer of the wafer lot is processed at 234 and the inspection wafers are subjected to the after development inspection by the operator at 204. If the layer just inspected is determined at 232 to be the last layer, the wafer lot is finished as indicated at 236.

In summary, the results and advantages of the method of the present invention can now be more fully realized. The method of the present invention thus effectively provides a semiconductor manufacturing process for the manufacturing of high performance integrated circuits that provides a method of capturing images of selected anomalies and storing the selected anomaly information in database and is retrievable for later review and analysis.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of manufacturing semiconductor devices, the method comprising:

processing a layer on a lot of semiconductor wafers;

selecting at least one inspection wafer from the lot of semiconductor wafers;

performing an after development in inspection on an after development inspection tool;

capturing images of selected anomalies on the layer;

generating image data including input lot, wafer, layer, location (x,y) and product type data for the selected anomalies;

generating linkage data for the captured images;

storing the image data and linkage data in a database;

adding the linkage data and image data to a wafer map if a wafer map exists; and creating a wafer map if a wafer map doesn't exist.

2. The method of claim 1 further comprising:

inspecting the layer for defects; and storing defect data in the database.

3. The method of claim 3 further comprising adding the defect data to the wafer map.

4. The method of claim 3 wherein the linkage data includes memory location of the image data.

* * * * *